United States Patent
Sun

(10) Patent No.: US 8,990,596 B2
(45) Date of Patent: Mar. 24, 2015

(54) SERVER SYSTEM AND HEAT DISSIPATION CONTROL METHOD DURING A STANDBY POWER SUPPLY AND DETECTION OF AN EXTENSION CARD INSERTION

(71) Applicants: Inventec (Pudong) Technology Corporation, Shanghai (CN); Inventec Corporation, Taipei (TW)

(72) Inventor: Yan-Long Sun, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 284 days.

(21) Appl. No.: 13/777,944

(22) Filed: Feb. 26, 2013

(65) Prior Publication Data

US 2014/0115348 A1 Apr. 24, 2014

(30) Foreign Application Priority Data

Oct. 24, 2012 (CN) .......................... 2012 1 0410706

(51) Int. Cl.

| G06F 1/00 | (2006.01) |
|---|---|
| G06F 1/20 | (2006.01) |
| H05K 7/20 | (2006.01) |
| G06F 1/26 | (2006.01) |
| G06F 1/18 | (2006.01) |
| G06F 1/32 | (2006.01) |

(52) U.S. Cl.
CPC .. *G06F 1/26* (2013.01); *G06F 1/20* (2013.01); *G06F 1/185* (2013.01); *G06F 1/3287* (2013.01); *G06F 1/3296* (2013.01); *H05K 7/20836* (2013.01); *Y02B 60/1282* (2013.01); *Y02B 60/1285* (2013.01); *Y02B 60/32* (2013.01)
USPC ........................ 713/300; 361/679.46; 361/695

(58) Field of Classification Search
CPC ..................................................... G06F 1/3203
USPC ......................................................... 713/300
See application file for complete search history.

(56) References Cited

U.S. PATENT DOCUMENTS

| 6,265,790 | B1 * | 7/2001 | Vogman ........................... 307/64 |
|---|---|---|---|
| 7,589,436 | B2 * | 9/2009 | Takahashi et al. .............. 307/66 |
| 8,243,474 | B2 * | 8/2012 | Chen et al. ...................... 363/17 |
| 8,405,986 | B2 * | 3/2013 | Sun et al. ....................... 361/695 |
| 2009/0052139 | A1 * | 2/2009 | Lai et al. ....................... 361/707 |
| 2011/0002098 | A1 * | 1/2011 | Xu .................................. 361/679.46 |
| 2012/0136498 | A1 * | 5/2012 | Chen et al. .................... 700/297 |
| 2013/0294025 | A1 * | 11/2013 | Davidson ................. 361/679.32 |

* cited by examiner

*Primary Examiner* — Suresh Suryawanshi
(74) *Attorney, Agent, or Firm* — Morris Manning & Martin LLP; Tim Tingkang Xia, Esq.

(57) ABSTRACT

A server system and a heat dissipation control method thereof are provided. A main power supply and a standby power supply respectively supplying a main voltage and a standby voltage of the server system are provided. An extension card module including at least one extension card slot allowing at least one extension card to insert into, is provided. A fan module including at least one fan used for dissipating heat from the extension card module is provided. When the main voltage is applied to the server system, the main voltage is applied to the fan to drive the fan. When the standby voltage is applied to the server system, the extension card module is determined whether to be inserted in any extension card. If yes, the standby voltage is applied to the fan to drive the fan; otherwise, the standby voltage is interrupted to stop the fan.

10 Claims, 3 Drawing Sheets

SERVER SYSTEM AND HEAT DISSIPATION CONTROL METHOD DURING A STANDBY POWER SUPPLY AND DETECTION OF AN EXTENSION CARD INSERTION

CROSS-REFERENCE TO RELATED APPLICATIONS

This non-provisional application claims priority under 35 U.S.C. §119(a) on Patent Application No(s). 201210410706.6 filed in China on Oct. 24, 2012, the entire contents of which are hereby incorporated by reference.

BACKGROUND OF THE DISCLOSURE

1. Technical Field of the Disclosure

The disclosure relates to a server system and a heat dissipation control method thereof.

2. Description of the Related Art

In a server system, because each area of a mainboard has its requirement, the server system performs different fan controls on these areas. For an extension card module in the server system, a main voltage is generally provided to a fan for dissipating heat from the extension card module. However, when a standby voltage is applied, the standby voltage is not provided to the fan, so that the heat on the extension card module cannot be dissipated. This causes the heat accumulation and makes the extension card module hot, and in a worst situation, an extension card might be damaged.

SUMMARY OF THE DISCLOSURE

The disclosure provides a server system comprising a main power supply, a standby power supply, an extension card module, a fan module, and a mainboard module. The main power supply is used for supplying a main voltage of the server system. The standby power supply is used for supplying a standby voltage of the server system. The extension card module comprises at least one extension card slot which allows at least one extension card to insert into. At least one fan of the fan module is used for dissipating heat from the extension card module. A controller of the mainboard module is used for, when the main voltage is applied to the server system, controlling the main voltage to drive the fan. When the standby voltage is applied to the server system, the controller detects whether any extension card is inserted into the at least one extension card slot. If at least one extension card is inserted into the at least one extension card slot, the controller controls the standby voltage to drive the fan; otherwise, the controller interrupts the applying of the standby voltage so as to stop the fan.

In an embodiment of the disclosure, the controller is further used for detecting a switchover of the server system between a standby voltage operation state and a main voltage operation state.

In an embodiment of the disclosure, when the server system switches from the standby voltage operation state to the main voltage operation state, the controller controls the main voltage to drive the fan.

In an embodiment of the disclosure, when the server system switches from the main voltage operation state to the standby voltage operation state, the controller interrupts the applying of the standby voltage, and then detects whether any extension card is inserted into the at least one extension card slot.

In an embodiment of the disclosure, the controller is a complex programmable logic device (CPLD) or a baseboard management controller (BMC). In an embodiment of the disclosure, the main power supply is an AC to DC power supplier, and the standby power supply is a DC to DC power supplier.

The disclosure also provides a heat dissipation control method, which is adapted to a server system and includes following steps. Providing a main power supply used for supplying a main voltage of the server system. Providing a standby power supply used for supplying a standby voltage of the server system. Providing an extension card module comprising at least one extension card slot which allows at least one extension card to insert into. Providing a fan module including at least one fan, which is used for dissipating heat from the extension card module. When the main voltage is applied to the server system, the main voltage is applied to the fan to drive the fan. When the standby voltage is applied to the server system, the extension card slot is determined whether any extension card is inserted into. If yes, the standby voltage is applied to the fan to drive the fan; otherwise, the applying of the standby voltage is interrupted so as to stop the fan.

In an embodiment of the disclosure, the heat dissipation control method also comprises following step. A switchover of the server system between a standby voltage operation state and a main voltage operation state is detected.

In an embodiment of the disclosure, the heat dissipation control method also comprises following step. When the server system switches from the standby voltage operation state to the main voltage operation state, the main voltage is applied to the fan to drive the fan.

In an embodiment of the disclosure, the heat dissipation control method also comprises following steps. When the server system switches from the main voltage operation state to the standby voltage operation state, the applying of the standby voltage is interrupted, and then the at least one extension card slot is detected whether any extension card is inserted into.

BRIEF DESCRIPTION OF THE DRAWINGS

The disclosure will become more fully understood from the detailed description given herein below for illustration only and thus does not limit the disclosure, wherein.

DETAILED DESCRIPTION

Figure 1:
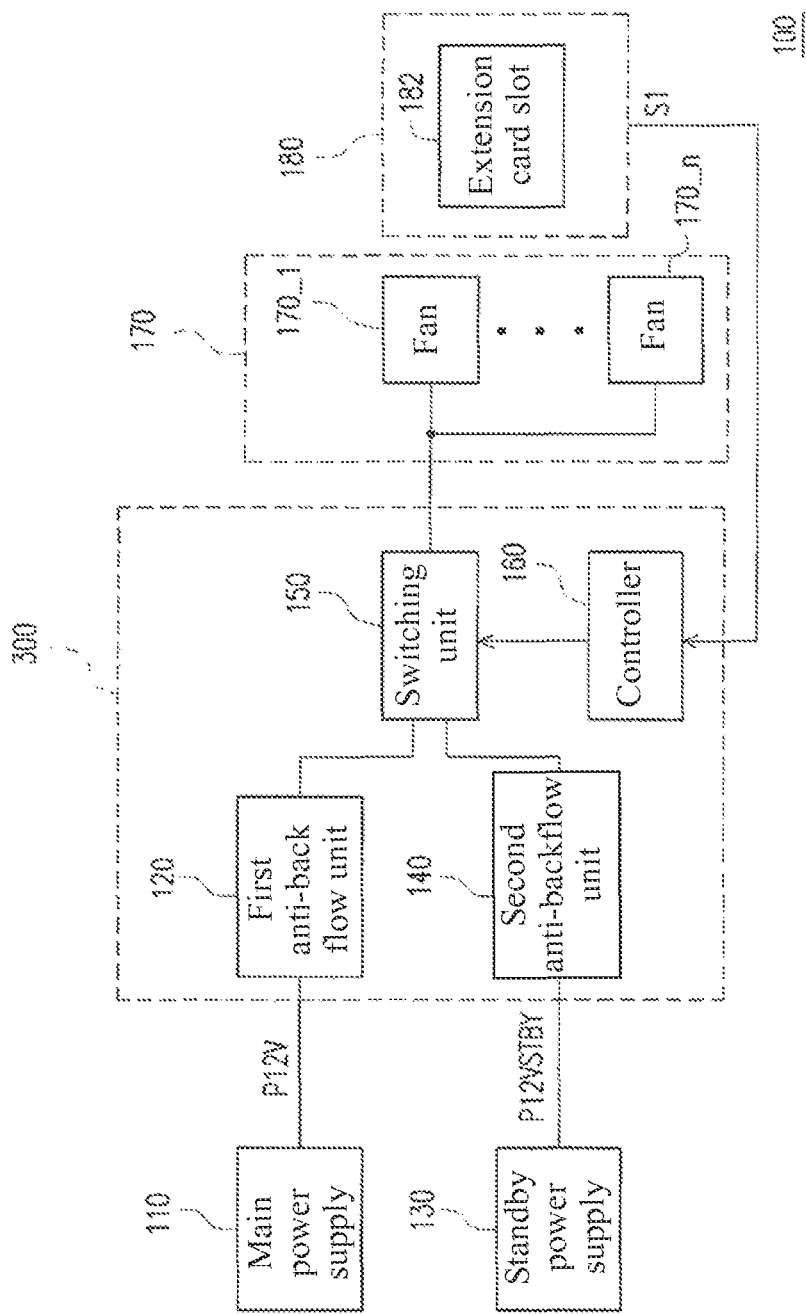
FIG. 1 is a schematic diagram of a server system according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the disclosure, components with the same labels are used for representing the same or similar parts in the drawings and implementations.

FIG. 1 is a schematic diagram of a server system according to an embodiment of the disclosure. A server system 100 includes a main power supply 110, a standby power supply 130, a fan module 170, an extension card module 180, and a mainboard module 300. The main power supply 110 is used for supplying a main voltage P12V of the server system 100.

The standby power supply 130 is used for supplying a standby voltage P12VSTBY of the server system 100. The extension card module 180 includes at least one extension card slot 182 which allows extension cards to insert into. The fan module 170 includes fans 170_1 to 170_n, and at least one fan of the fan module 170 is used for dissipating heat from the extension card module 180. For example, the fan 170_1 is used for dissipating heat from the extension card module 180.

The mainboard module 300 includes a controller 160. The controller 160 is used for detecting a switchover of the server system 100 between a standby voltage operation state and a main voltage operation state. When the server system 100 is in the main voltage operation state, the controller 160 controls the main voltage P12V to apply to the fan module 170 to drive the fans 170_1 to 170_n.

When detecting that the server system 100 switches from the main voltage operation state to the standby voltage operation state, the controller 160 interrupts the applying of the standby voltage P12VSTBY, and then detects whether an extension card is inserted into the extension card slot 182. For example, when the server system 100 is in the standby voltage operation state, and when one extension card is inserted into the extension card slot 182, the controller 160 controls the standby voltage P12VSTBY to apply to the fan 170_1, so that the fan 170_1 dissipates heat from the extension card module 180; otherwise, the applying of the standby voltage P12VSTBY is interrupted so as to stop the fan 170_1.

In addition, in this and some other embodiments, the mainboard module 300 also includes a first anti-backflow unit 120, a second anti-backflow unit 140, and a switching unit 150. In the main voltage operation state, by controlling the operation of the switching unit 150, the controller 160 powers the fan module 170 to work with the main voltage P12V. Herein, while the main power supply 110 is applied, the standby power supply 130 stops supplying the standby voltage P12VSTBY.

In the standby voltage operation state, the controller 160 controls the operation of the switching unit 150 according to whether a detection signal S1 is received or not. If the detection signal S1 is received, the switching unit 150 allows the standby voltage P12VSTBY to power the fan 170_1, so as to dissipate heat from the extension card module 180. If the detection signal S1 is not received, the fan 170_1 is not powered, that is, no extension card is inserted into the extension card slot 182. Thus, energy consumption may be reduced.

Furthermore, when the server system 100 is powered by main power supply 110 instead of the standby power supply 130, the main power supply 110 supplies the main voltage P12V for the fan module 170 to drive the fans 170_1 to 170_n.

As set forth above, in the standby voltage operation state, if no extension card is inserted into the extension card slot 182, the heat dissipation is not performed on the extension card module 180, but if an extension card is inserted into the extension card slot 182, the heat dissipation is performed on the extension card module 180.

Figure 2:
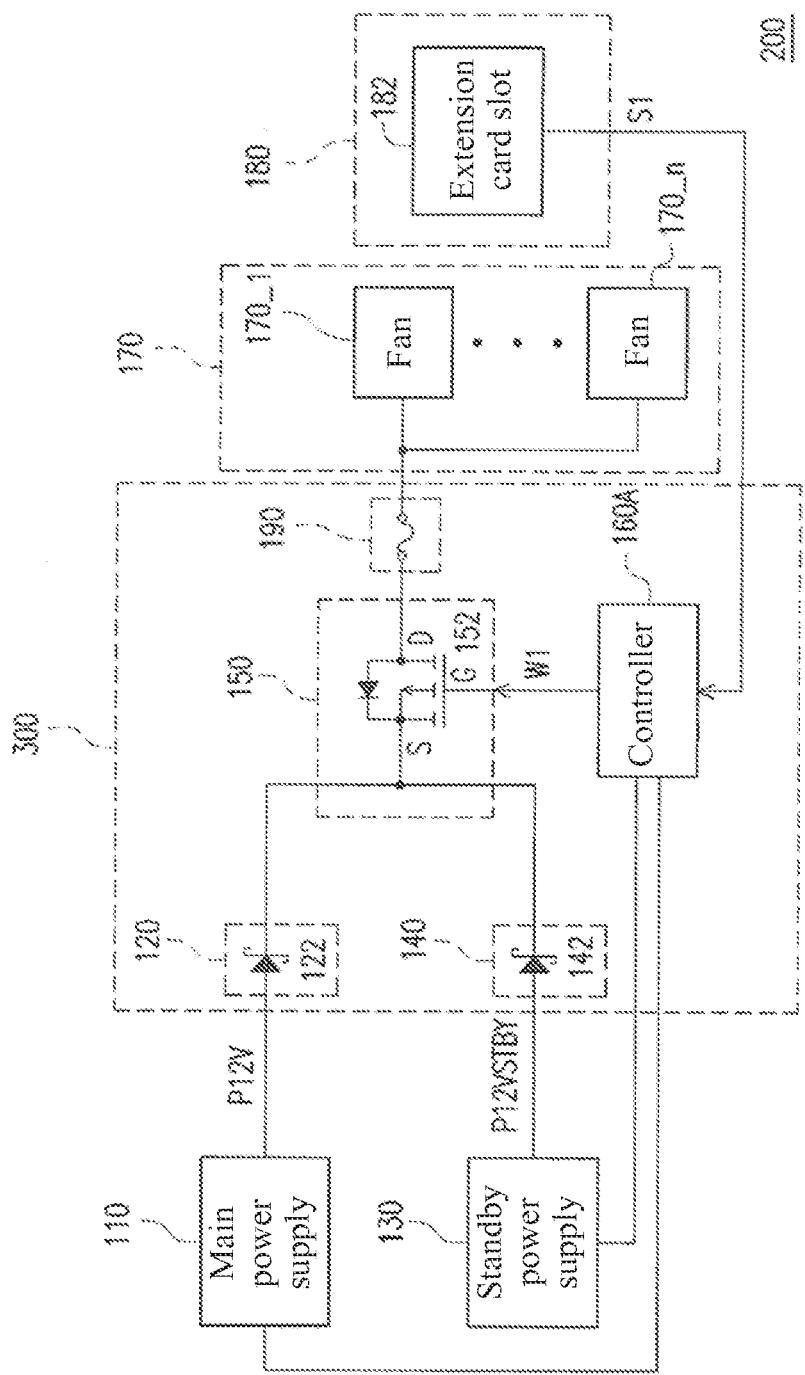
FIG. 2 is a schematic diagram of a server system according to another embodiment of the disclosure.

To further illustrate the server system, another embodiment is taken as follows. FIG. 2 is a schematic diagram of a server system according to another embodiment of the disclosure. Components of a server system 200 are similar to those of the server system 100 in FIG. 1, and hereby a part of the components are illustrated in detail. The switching unit 150 includes, for example, an MOS switch 152. For example, the MOS switch 152 is a PMOS.

In this and some other embodiments, the first anti-backflow unit 120 includes a Schottky diode 122, and the second anti-backflow unit 140 includes a Schottky diode 142. The Schottky diodes 122 and 142 are diodes that have low turned-on voltages, allow high speed switching, and prevent reverse conduction of a power supply path. An anode end of the Schottky diode 122 is electrically connected to an output end of the main power supply 110, and a cathode end of the Schottky diode 122 is electrically connected to a source end of the MOS switch 152. An anode end of the Schottky diode 142 is electrically connected to an output end of the standby power supply 130, and a cathode end of the Schottky diode 142 is electrically connected to the source end (S) of the MOS switch 152.

In this and some other embodiments, a controller 160A is a complex programmable logic device (CPLD) or a baseboard management controller (BMC), and the controller 160A is electrically connected to the main power supply 110 and the standby power supply 130.

In this and some other embodiments, implementation modes of the controller 160A are varied in the following ways. In a first implementation mode, if the controller 160A controls the main power supply 110 and the standby power supply 130 in an active manner, the controller 160A controls a switchover between the main power supply 110 and the standby power supply 130. In a second implementation mode, if the controller 160A controls the main power supply 110 and the standby power supply 130 in a non-active manner, the controller 160A learns of a current switchover between power supply states by detecting voltage potentials of the main power supply 110 and the standby power supply 130.

On the other hand, when an extension card is inserted into the extension card slot 182 of the extension card module 180, the extension card module 180 automatically transmits a detection signal S1 with a high level to the controller 160. In a standby voltage operation state, when receiving the detection signal S1, the controller 160 transmits a control signal W1 to a gate end (G) of the MOS switch 152 to turn on the MOS switch 152, so that the standby voltage P12VSTBY powers the fans, for example, the fan 170_1 used for dissipating heat from the extension card module 180. In the standby voltage operation state, if the controller 160 does not receive the detection signal S1, the transmitted control signal W1 does not turn on the MOS switch 152, so that the fan 170_1 is not powered.

In this and some other embodiments, the main power supply 110 is an AC to DC power supplier, and the standby power supply 130 is a DC to DC power supplier.

In this and some other embodiments, the server system 200 also includes a fuse unit 190 coupled between a drain end (D) of the MOS switch 152 and the fan module 170. The fuse unit 190 is, for example, used for enhancing power supply safety.

Figure 3:
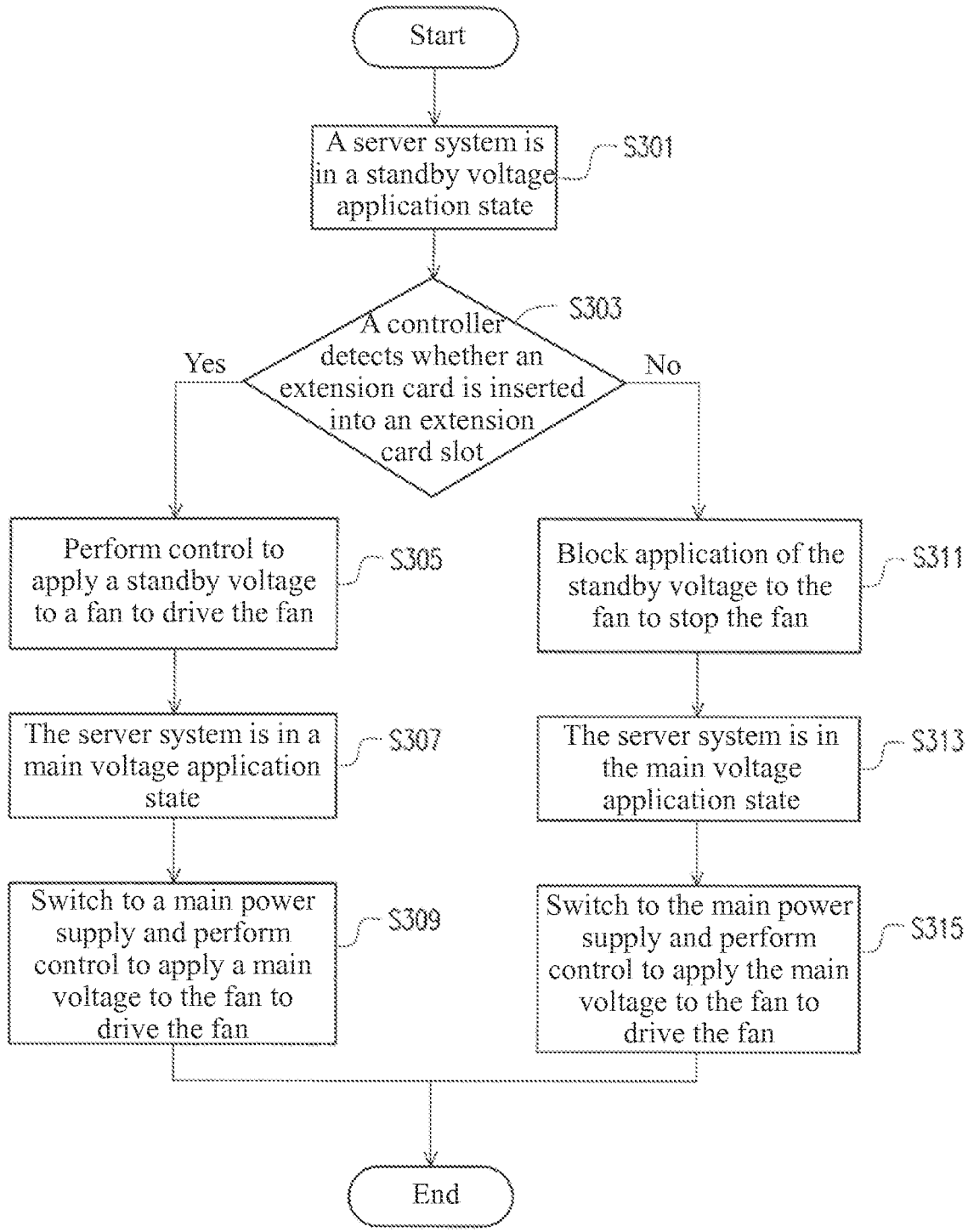
FIG. 3 is a flow chart of a heat dissipation control method according to an embodiment of the disclosure.

FIG. 3 is a flow chart of a heat dissipation control method in an embodiment of the disclosure. Referring to both FIG. 1 and FIG. 3, the heat dissipation control method in this embodiment is applicable to the server system 100 and includes the following steps.

In Step S301, the server system 100 is in the standby voltage operation state.

In Step S303, the controller 160 detects whether an extension card is inserted into the extension card slot 182. If yes, proceed to Step S305; otherwise, proceed to Step S311.

In Step S305, the standby voltage P12VSTBY is applied to the fan 170_1, which is used for, for example, dissipating heat from the extension card module 180, to drive the fan 170_1, so as to dissipate heat from the extension card module 180. In Step S307, the server system 100 is in the main voltage operation state. In Step S309, the main power supply 110 is selected, and the main voltage P12V is applied to the fan 170_1 to continue driving the fan 170_1.

In Step S311, the applying of the standby voltage P12VSTBY is interrupted so as to stop the fan 170_1. In Step S313, the server system 100 is in the main voltage operation state. In Step 5315, the main power supply 110 is selected, and the main voltage P12V is applied to the fan 170_1 to drive the fan 170_1.

In this and some other embodiments, if the server system 100 is in the main voltage operation state before Step S301, and when the server system 100 switches from the main voltage operation state to the standby voltage operation state and the process proceeds to Step S301, the applying of the standby voltage P12VSTBY is interrupted, and then Step S303 is performed to detect whether an extension card is inserted into the extension card slot 182.

Accordingly, in the standby voltage operation state, when no extension card is inserted into the extension card slot 182, the heat dissipation is not performed on the extension card module 180, but when an extension card is inserted into the extension card slot 182, the heat dissipation is performed on the extension card module 180. Therefore, the heat dissipation problem of the extension card module 180 may be solved, the energy consumption may be reduced, and the heat dissipation efficiency may be increased.

What is claimed is:

1. A server system, comprising:
   a main power supply, for supplying a main voltage of the server system;
   a standby power supply, for supplying a standby voltage of the server system;
   an extension card module, comprising at least one extension card slot which allows at least one extension card to insert into;
   a fan module, at least one fan of the fan module being used for dissipating heat from the extension card module; and
   a mainboard module, a controller on the mainboard module being used for, when the main voltage is applied to the server system, controlling the main voltage to drive the fan, for, when the standby voltage is applied to the server system, detecting whether any extension card is inserted into the at least one extension card slot, and for, if one extension card is inserted into the at least one extension card slot, controlling the standby voltage to drive the fan, and otherwise, interrupting the standby voltage to stop the fan.

2. The server system according to claim 1, wherein the controller is further used for detecting a switchover of the server system between a standby voltage operation state and a main voltage operation state.

3. The server system according to claim 2, wherein when the server system switches from the standby voltage operation state to the main voltage operation state, the controller controls the main voltage to drive the fan.

4. The server system according to claim 2, wherein when the server system switches from the main voltage operation state to the standby voltage operation state, the controller interrupts the standby voltage, and then detects whether any extension card is inserted into the at least one extension card slot.

5. The server system according to claim 1, wherein the controller is a complex programmable logic device (CPLD) or a baseboard management controller (BMC).

6. The server system according to claim 1, wherein the main power supply is an AC to DC power supplier, and the standby power supply is a DC to DC power supplier.

7. A heat dissipation control method, adapted to a server system, and comprising:
   providing a main power supply used for supplying a main voltage of the server system;
   providing a standby power supply used for supplying a standby voltage of the server system;
   providing an extension card module comprising at least one extension card slot which allows at least one extension card to insert into;
   providing a fan module, at least one fan of the fan module being used for dissipating heat from the extension card module;
   when the main voltage is applied to the server system, applying the main voltage to drive the fan;
   when the standby voltage is applied to the server system, detecting whether any extension card is inserted into the at least one extension card slot;
   if yes, controlling the standby voltage to drive the fan; and otherwise, interrupting the standby voltage to stop the fan.

8. The heat dissipation control method according to claim 7, further comprising:
   detecting a switchover of the server system between a standby voltage operation state and a main voltage operation state.

9. The heat dissipation control method according to claim 8, further comprising:
   when the server system switches from the standby voltage operation state to the main voltage operation state, applying the main voltage to the fan to drive the fan.

10. The heat dissipation control method according to claim 8, further comprising:
    when the server system switches from the main voltage operation state to the standby voltage operation state, interrupting the standby voltage, and then detecting whether any extension card is inserted into the at least one extension card slot.

* * * * *